(12) United States Patent
Moinuddin (10) Patent No.: US 10,241,140 B2
(45) Date of Patent: Mar. 26, 2019

(54) SYSTEMS AND METHODS FOR MONITORING POWER CONSUMPTION

(71) Applicant: Syed Imran Mahmood Moinuddin, Karachi (PK)

(72) Inventor: Syed Imran Mahmood Moinuddin, Karachi (PK)

( * ) Notice: Subject to any disclaimer, the term of this patent is extended or adjusted under 35 U.S.C. 154(b) by 122 days.

(21) Appl. No.: 15/406,397

(22) Filed: Jan. 13, 2017

(65) Prior Publication Data

US 2017/0205451 A1 Jul. 20, 2017

Related U.S. Application Data

(60) Provisional application No. 62/278,583, filed on Jan. 14, 2016.

(51) Int. Cl.
*G01R 21/133* (2006.01)
*G01D 4/00* (2006.01)
*G01R 31/02* (2006.01)

(52) U.S. Cl.
CPC ............. *G01R 21/133* (2013.01); *G01D 4/00* (2013.01); *G01R 31/025* (2013.01); *Y02B 90/245* (2013.01); *Y04S 20/38* (2013.01); *Y04S 20/40* (2013.01)

(58) Field of Classification Search
CPC ................................. G01R 21/133; G01D 4/00
USPC .......................................................... 702/62
See application file for complete search history.

(56) References Cited

U.S. PATENT DOCUMENTS

| | | | | |
|---|---|---|---|---|
| 2005/0116836 A1* | 6/2005 | Perry | ....................... | H04Q 9/00 340/870.02 |
| 2011/0172836 A1* | 7/2011 | Boss | ....................... | G01D 4/00 700/291 |
| 2013/0231790 A1* | 9/2013 | Shao | ....................... | G06Q 10/10 700/291 |
| 2015/0309095 A1* | 10/2015 | Monnerie | ............ | G01R 21/133 702/60 |

\* cited by examiner

*Primary Examiner* — Ricky Ngon
(74) *Attorney, Agent, or Firm* — Phillips, Ryther & Winchester; Justin K. Flanagan (57) ABSTRACT

The present disclosure provides systems and methods for monitoring power consumption of individual devices on an electric power system. A monitoring system may identify unique power characteristics of each device. The monitoring system may use the identified unique power characteristics to disaggregate electric data representative of the power consumption of all of the devices on the electric power system into portions associated with each device.

9 Claims, 10 Drawing Sheets

FIG. 6

SYSTEMS AND METHODS FOR MONITORING POWER CONSUMPTION

TECHNICAL FIELD

This disclosure relates to monitoring systems and methods in electric power systems. More particularly, this disclosure relates to systems and methods for monitoring electric power consumption of individual devices.

BRIEF DESCRIPTION OF THE DRAWINGS

Non-limiting and non-exhaustive embodiments of the disclosure are described herein, including various embodiments of the disclosure with reference to the figures listed below.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power consumption of a circuit may be monitored in residential premises and commercial facilities to detect overloads, short circuits, unexpected power use, and other fault conditions. Further, electric power consumption may be monitored to provide detailed and accurate data for businesses and homeowners to evaluate the electric power consumed during operation of specific appliances/devices. For example, a failure may be present in an appliance, and may cause a change (increase or decrease) in current flow during operation or initialization, or when it should otherwise be turned off. For example, some amount of current may flow through an appliance into a ground or other shorting medium in response to one or more short circuit faults. An electric power monitoring system may be configured to evaluate electric power consumption for individual devices and possibly to detect anomalies (e.g., a short circuit fault) based on an optimal and/or historical power consumption value, electrical signatures, power consumption trends, power consumption patterns, and/or a measured power consumption value of the device. Commercial embodiments, in some instances, may be in communication with one or more protective relays.

For instance, a protective relay may employ Field Programmable Gate Arrays (FPGAs), microcontrollers, CPUs, analog to digital (ND) converters, electronic displays, communication ports, and other electronic devices and systems to digitize power system currents and/or voltages and/or process data associated with the digitized currents and voltages according to various methods and/or digital filters. A protective relay may be configured to make protection decisions based on data associated with digitized power system currents and/or voltages, electrical signatures, power consumption trends, and/or power consumption patterns, and may communicate decisions made by a protective relay to an appropriate system or personnel, and/or may otherwise cause a suitable response to the digitized power system currents and/or voltages.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, FPGA, or other customized or programmable device. The computer may also include a computer-readable storage device, such as non-volatile memory, static RAM, dynamic RAM, ROM, CD-ROM, disk, tape, magnetic memory, optical memory, flash memory, or another computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables; telephone lines; satellites; microwave relays; modulated AC power lines; physical media transfer; wireless radio links; and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium. A software module may, for instance, comprise one or more physical or logical blocks of computer instructions, which may be organized as a routine, program, object, component, data structure, etc., that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network. In alternative embodiments, data may be stored in any of a wide variety of manners known to be useful, including non-relational databases such as NoSQL or other key-value approaches.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. In other instances, well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

Figure 1:
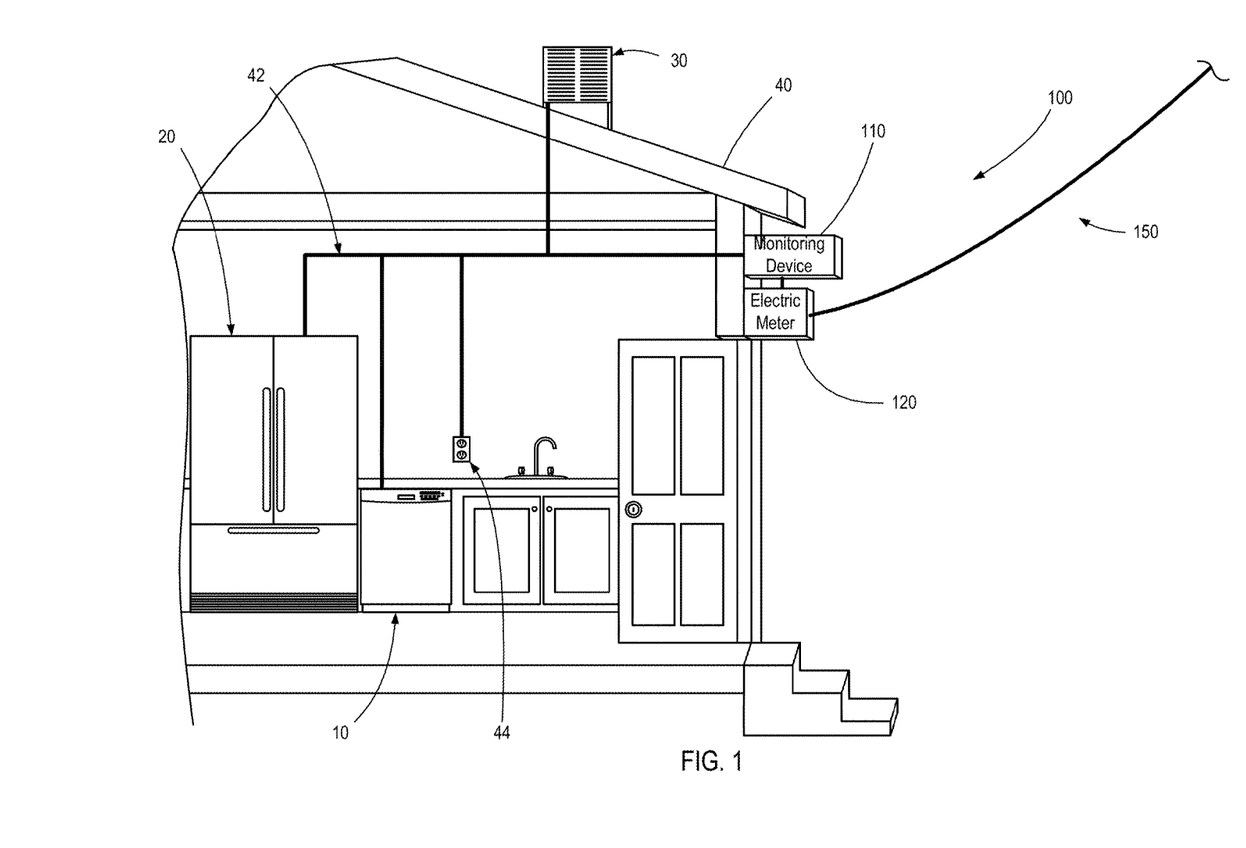
FIG. 1 illustrates a power consumption monitoring system, according to one embodiment, in electrical communication with the electric power meter of a home.

FIG. 1 illustrates a power consumption monitoring system 100, according to one embodiment, in electrical communication with an electric power meter 120 of a home 40. The power consumption monitoring system 100 may measure, analyze, characterize, and/or monitor electric power usage in various settings. The power consumption monitoring system 100 may monitor electric power consumption in a variety of commercial settings and/or a variety of residential settings based on the number of appliances the power consumption monitoring system 100 may monitor and/or track. The electric power received by the electric meter 120 may be supplied, at 150, by an external utility company, a generator, a grid tie, solar panels, wind-generated power, and/or any other power generation source.

For example, the power consumption monitoring system 100 may be configured to monitor power consumption in a commercial setting where a large number of appliances and/or devices receive and consume electric power from a single circuit. Even more specifically, the power consumption monitoring system 100 may monitor electric power consumption for a circuit of only a handful of electric devices or for a circuit of 50 or more concurrently operating electric devices/appliances, such as in a commercial setting. Thus, the power consumption monitoring system 100 may monitor the electric power consumption of one or more appliances/electric devices of a factory, retail center, laundromat, office building, and/or any other suitable commercial setting in which electric power is consumed.

Further, the power consumption monitoring system 100 may monitor electric power consumption in a number of settings that include a single circuit or a single circuit breaker, from which electric power is supplied to a plurality of electric appliances/devices (potentially protected by other downstream breakers or other protection devices). The power consumption monitoring system 100 may operate in some settings (e.g., residential settings) that may include fewer appliances of the same design and/or function in simultaneous operation relative to a commercial setting.

For example, the power consumption monitoring system 100 may monitor electric power consumption of a dishwasher 10, a refrigerator 20, an air conditioner 30, and any other suitable device connected to an electric circuit 42 the power consumption monitoring system 100 is monitoring (e.g., via an electrical outlet 44).

The power consumption monitoring system 100 may measure electric power consumption of a circuit 42 utilizing an electric meter 120. The electric meter 120 may be a component specific to the power consumption monitoring system 100, and may be configured based on the number of devices receiving electric power from the circuit 42. The electric meter 120 may be configured to communicate electric power consumption values to a monitoring device 110, and may communicate the values as a digital quantity and/or an analog value. Alternatively, the monitoring device 110 may be configured to measure the values associated with one or more phase and/or neutral lines associated with the input(s) and/or output(s) of the electric meter 120.

The monitoring device 110 may be an invasive or a non-invasive retrofit to an existing power distribution system. In certain embodiments, the electric meter 120 may be an existing electric meter used to measure electric power consumption and configured in electrical communication with the power consumption monitoring system 100. For example, in an invasive retrofit, the monitoring device 110 may be directly tied to one of the lines of an existing power distribution system. Current transformers may be used to isolate the monitoring device 110 from the line. In a non-invasive retrofit embodiment, the monitoring device 110 may receive electric power consumption from an output of an electric meter or through communication with a power company's server.

The electric meter 120 may communicate measured electric power values to the monitoring device 110 for a first time interval and at a determined sampling rate (e.g., a determined number of data points corresponding to each unit of time). For example, the monitoring device 110 may receive an electric power consumption value as measured by the electric meter 120 at a rate of 200-4,000 values/second. In some embodiments, the number of measurements and/or the resolution of the measurements may be even greater than that.

In various embodiments, existing or integrated electric meter monitoring systems may be unable to measure the electric power consumption at a sufficiently high rate or resolution and/or may utilize communication protocols that are bandwidth limited to lower data rates and/or resolutions. In such embodiments, existing electric meter monitoring systems may be supplemented or replaced with invasive or non-invasive monitoring systems that are able to record data at a higher rate (e.g., at a rate of 200-4,000 values per second). For example, a second electric meter with a higher sampling rate may be installed in addition to the existing electric meter 120.

Additionally, the monitoring device 110 may execute one or more subroutines and/or methods to characterize and/or match one or more portions of the received electric power consumption values with one or more device profiles. The monitoring device 110 may perform all of the calculations via onboard computing power. In other embodiments, the monitoring device 110 may supplement onboard computer power with cloud-based or offsite computing systems and/or may rely entirely on cloud-based or offsite computing systems.

In various embodiments, the processing, decision making methods, data storage, and the like may be abstracted from the end user such that the end user merely has access to results of such processing. For example, a user may be presented with a graphical depiction of each appliances power consumption and a total power consumption on a personal electronic device. In various embodiments, an application programming interface (API) may allow other programs to access data from the monitoring device 110, including possible raw data, processed data, and/or other insights gleaned from that data.

Each subroutine and/or method may be configured to facilitate a characterization of one or more portions of the received electric power consumption values according to a device profile corresponding to the operation of a specific device. One aspect of the subroutine and/or method may include an analysis of the event-based electrical signals embedded within the measurement data. Slices of the original electrical signals may indicate a specific appliance type. Additionally, the ability to break down the component parts of the electrical signals through disaggregation allows for the "signatures" of specific appliances (or other electrical components) to be identified.

Stated differently, the monitoring device 110 may determine that one or more portions of the received electric power values correspond to one or more device profiles. As an example, a portion of the received electric power values may indicate that a clothes dryer and an air conditioner are in use. The identified signature may correspond to two devices being used in combination, without necessarily being able to distinguish between the two. Additionally or alternatively, the mapping of portions of electric power values to identified electrical components may be N:M, where N is any integer and M is any integer that may be less than, equal to, or greater than N. For example, one device may have one or more electrical signatures associated with it. For instance, an oven may have a different electrical signature when used on broil versus conventional baking. Additionally, more than one device may have a similar electric signature in certain operating modes.

The monitoring device 110 may identify one or more devices consuming electric power based on a device profile determined to correspond to the received electric power values. Each device profile may be based on historical signatures, factory witness testing, nameplate ratings, manufacturers' specifications, and/or other measured or calculated values. The monitoring device 110 may have preprogrammed baseline or default device profiles for some devices. These baseline or default profiles may be updated based on historical signatures, factory witness testing, nameplate ratings, manufacturers' specifications, and/or other measured or calculated values.

In some embodiments, the characterization of a device's electric power consumption values may be determined through a calibration process. For example, the monitoring device 110 may receive a signal indicating the addition of a new device in the home 40. The monitoring device 110 may characterize the device by analyzing and recording event-based signals generated by the device. For instance, the monitoring device 110 may send a signal to a user or the device to turn the device on and off. The monitoring device 110 may then identify electric power consumption characteristics of the device during initialization, operation, and termination. Each of these may have a unique signature characterized by specific voltage levels, current levels, power factor, and/or frequencies as a function of time.

The received electric power values may be disaggregated in order to identify correspondence of particular portions of the electric power values to specific devices consuming electric power. For example, the electric power values from two devices having different signatures may be separated. This may allow the electric power consumption of both devices to be monitored independently.

In certain embodiments, received electric power values may be determined to possibly correspond to a plurality of device profiles. The monitoring device 110 may be configured to compute and/or otherwise determine a confidence index for each device profile determined to possibly correspond to the received electric power values.

For example, the monitoring device 110 may make a statistical or probabilistic calculation of a likelihood that the received electric power values correspond to a given device profile based on the nature and degree of similarity between the received electric power values and the device profile.

The likelihood that the determinations made by the monitoring device 110 are correct are based on a plurality of confidence indices computed by the monitoring device 110 (or a remote analytics component, such as a cloud computing platform) for each device profile determined to correspond to each respective received electric power values. The monitoring device 110 may compute a confidence index corresponding to each determination made with a specific method of the monitoring device 110. In a disparate computing approach, the monitoring device 110 may be specifically focused on high resolution data capture and most or even all processing of that data may be performed in the cloud or by some other remote computing device.

For example, some embodiments may include subroutines and/or methods such as a Fast Fourier Transform (FFT) analysis, Computer Vision Analysis (CVA), deep learning based analysis and/or Speech Recognition Analysis (SRA) of the received electric power values. For every determination made by the monitoring device 110 (possibly via a remote/cloud-based analytics component) that a portion of the received electric power values corresponds to a device profile based on one of the preceding subroutines and/or methods, a confidence index may be computed.

For example, the monitoring device 110 may perform an FFT function on the values received from the electric meter 120 and may match one or more portions of the result of the FFT function with one or more portions of a device profile in the frequency domain. The monitoring device 110 may then determine that a portion of the electric power values analyzed using the FFT function corresponds to the device profile of the air conditioner 30. Further, the monitoring device 110 may compute an index of confidence corresponding to that determination, based on the amount and nature of similarities between the results of the FFT function and the device profile of the air conditioner 30. The baseline or default device profile of the air conditioner 30 may be based on historical signatures, factory witness testing, nameplate ratings, manufacturers' specifications, and/or other measured or calculated values.

The monitoring device 110 may determine a composite confidence index based on each of the determined confidence indices. As used throughout this disclosure, it is understood that determinations, computations, calculations, processing, the implementations of subroutines and/or methods, and the like that are described as performed by a monitoring device, such as the monitoring device 110, may alternatively or additionally be performed or supplemented by cloud-based computing resources and/or other remote computing resources external to the physical monitoring device 110. In such embodiments, API or user interactions may be facilitated by the remote or cloud-based computing resources and/or associated remote data storage. A fusion subroutine and/or method combining two or more analyses and/or methods may be implemented locally or in the cloud.

A composite confidence index may express the likelihood that one portion of the received electric power values corresponds to a specific device profile based on the confidence index determined for that portion of the values by each subroutine and/or method performed by the monitoring device 110. Identifying a device via the composite confidence index may allow the monitoring device 110 and/or communicatively connected analytics device or recorder to monitor, measure, and/or otherwise track electrical usage.

To enable proactive maintenance of devices that consume electric power, the power consumption monitoring system 100 may determine whether a short circuit, unwanted electrical connection to ground, or other failure/fault condition exists in one or more devices. For example, the power consumption monitoring system 100 may determine an optimal electric power consumption value of a device during operation of the device without any internal failures.

Further, the power consumption monitoring system 100 may determine an actual operating or measured electric power consumption value of the device, which value may correspond to electric power consumption with one or more failures of the device present. The power consumption monitoring system 100 may compare the optimal, historical, or other baseline electric power consumption value with the measured electric power consumption value of the device. Based on the comparison, if the measured value is greater than the baseline or optimal electric power consumption value, then the monitoring device 110 may indicate that the device should be serviced or that maintenance of the device should be scheduled. In some embodiments, the monitoring device 110 may automatically send an alert to a user or maintenance personal about a change in power consumption. Relatedly, if the measured value corresponds to identified signatures of a fault or other circuit anomaly, the fault or other circuit anomaly may raise an event flag and/or trigger a notification. In some embodiments, an identification of a problem or other anomaly may trigger or otherwise actuate a protection device, such as a circuit breaker.

Figure 2A:
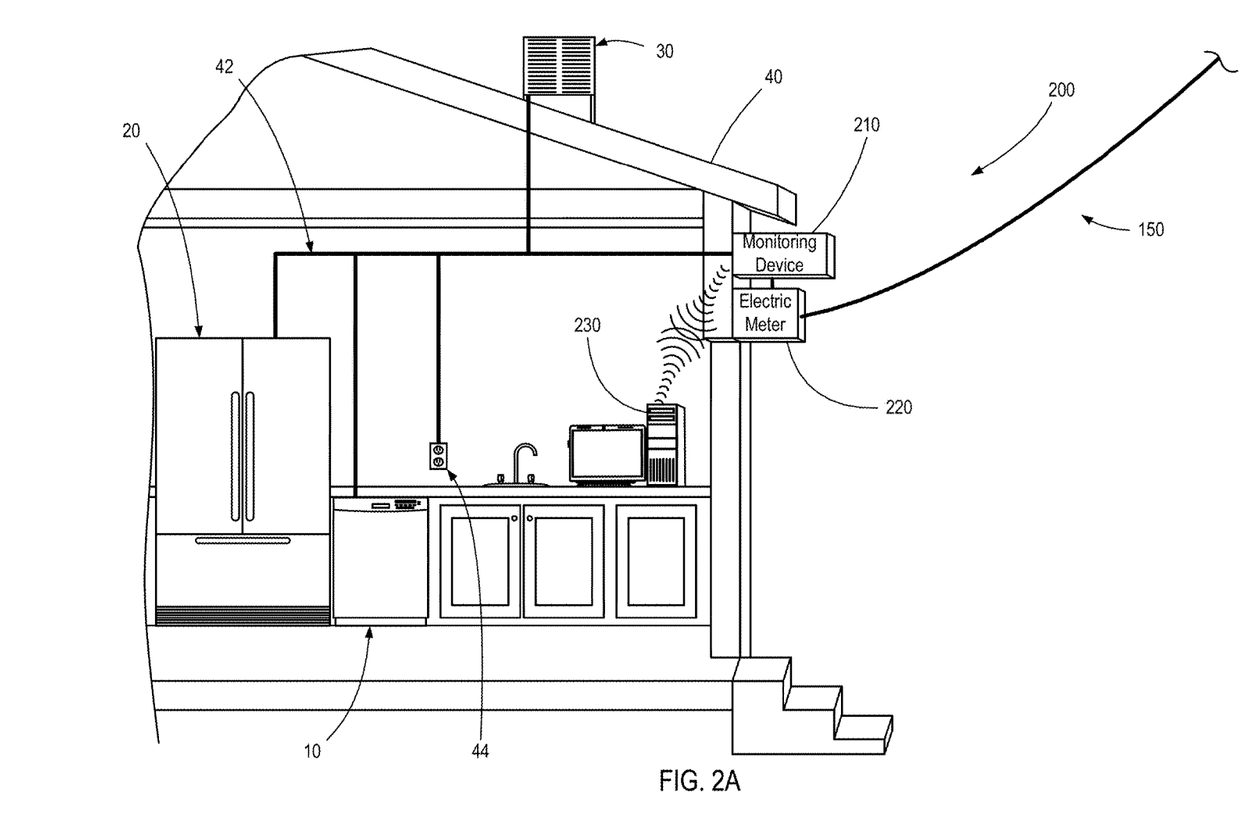
FIG. 2A illustrates a power consumption monitoring system, according to another embodiment, configured to wirelessly communicate with a remote computing device.

FIG. 2A illustrates a power consumption monitoring system 200, according to another embodiment, configured to wirelessly communicate with a computing device 230. In such an embodiment, a monitoring device 210 may utilize the computing resources and/or network connectivity of the computing device 230. For example, the monitoring device 210 may use a local transceiver to communicate with the computing device 230 and use the network of the computing device 230 to send monitoring data and/or warnings to a user.

In some embodiments, some devices may be connected to the network associated with the computing device 230. The monitoring device 210 may use the network connectivity of the computing device 230 to collect information about the connected device. In some embodiments, the monitoring device 210 may even control the connected devices. For instance, the monitoring device 210 may calibrate a device profile by commanding a connected device to perform a series of events and recording the resulting electric power consumption characteristics to the device profile.

Figure 2B:
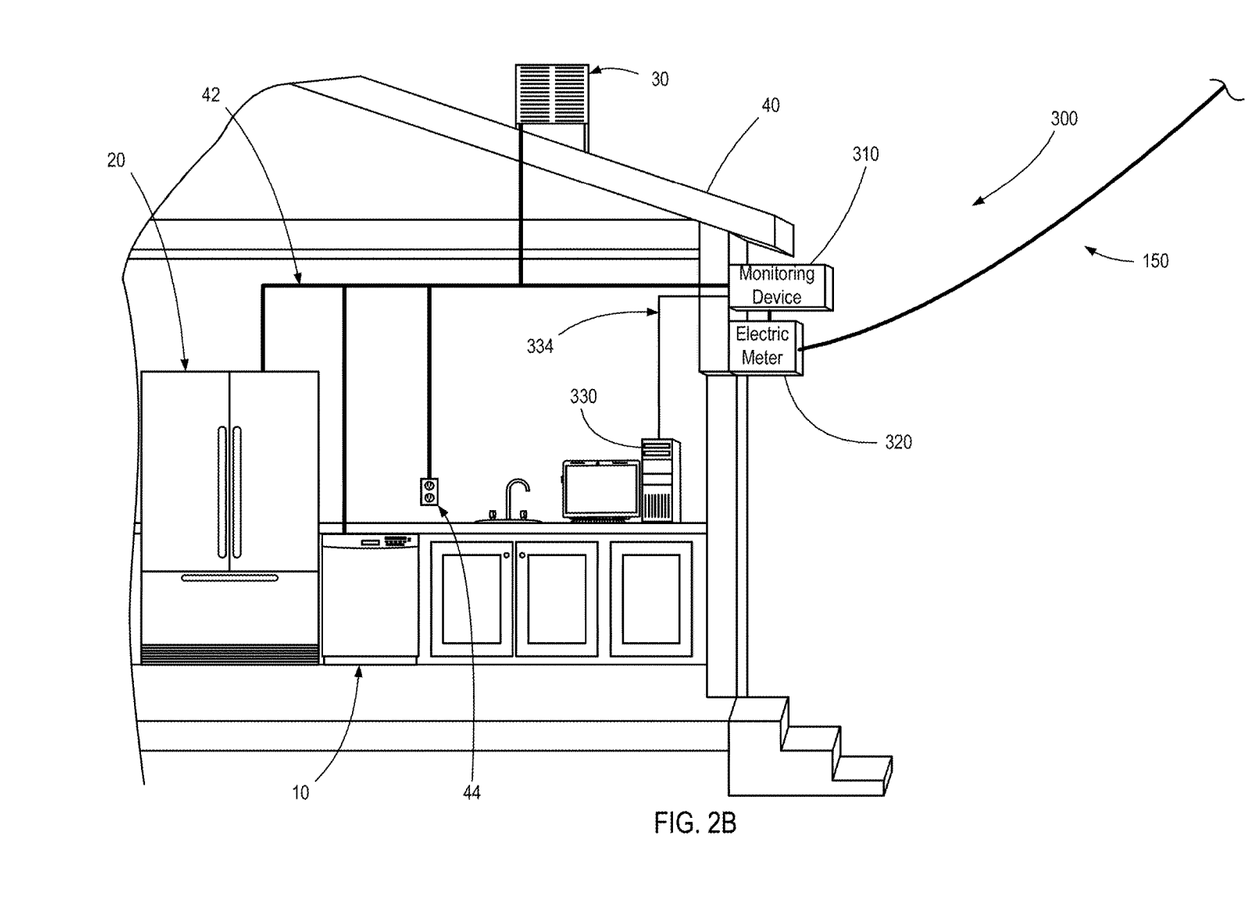
FIG. 2B illustrates a power consumption monitoring system, according to another embodiment, configured to communicate via a wired connection with a remote computing device.

FIG. 2B illustrates a power consumption monitoring system 300, according to another embodiment, configured to communicate via a wired connection 334 with a computing device 330. Again, a monitoring device 310 may utilize the computing resources and/or network connectivity of the computing device 330.

Figure 2C:
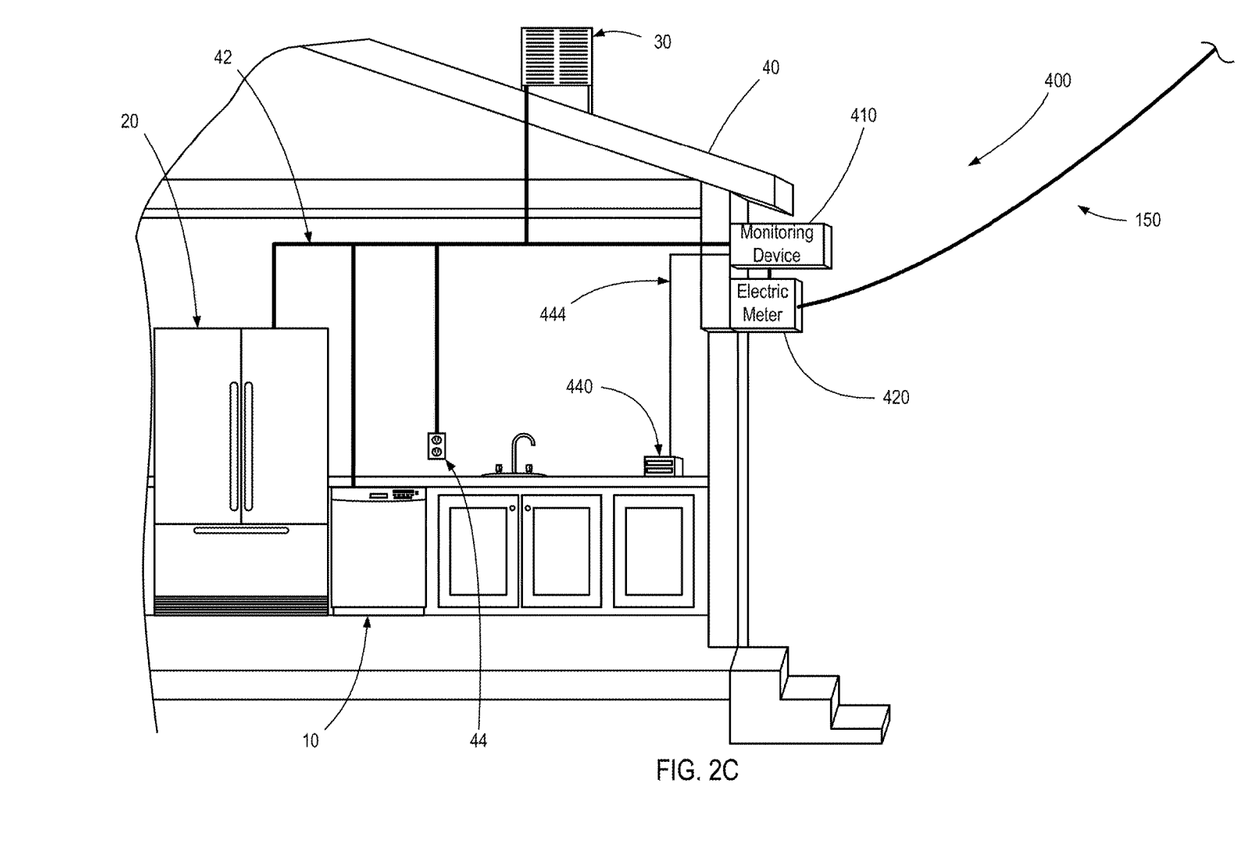
FIG. 2C illustrates a power consumption monitoring system, according to another embodiment, configured to communicate via a wired connection with a remote computer-readable storage medium.

FIG. 2C illustrates a power consumption monitoring system 400, with a monitoring device 410 configured to communicate via a wired connection 444 with a computer-readable storage medium 440. The computer-readable storage medium 440 may be used to store data associated with baseline signatures of electric devices, usage information, anomaly detection, defect situations, faults, and/or other information.

With reference to the embodiments of FIGS. 2A-2C generally and collectively, the power consumption monitoring system may be configured to communicate one or more values (e.g., confidence index, measured power data, characterization of a portion of power data) with a remote computing device. An example of such a system is illustrated and described below in conjunction with FIG. 2D. The system may communicate data to a remote server or suitable form of cloud storage. In some embodiments of the system, data may be received from a computer-readable storage medium. Alternatively, data can be collected by one device and sent to a second device.

Figure 2D:
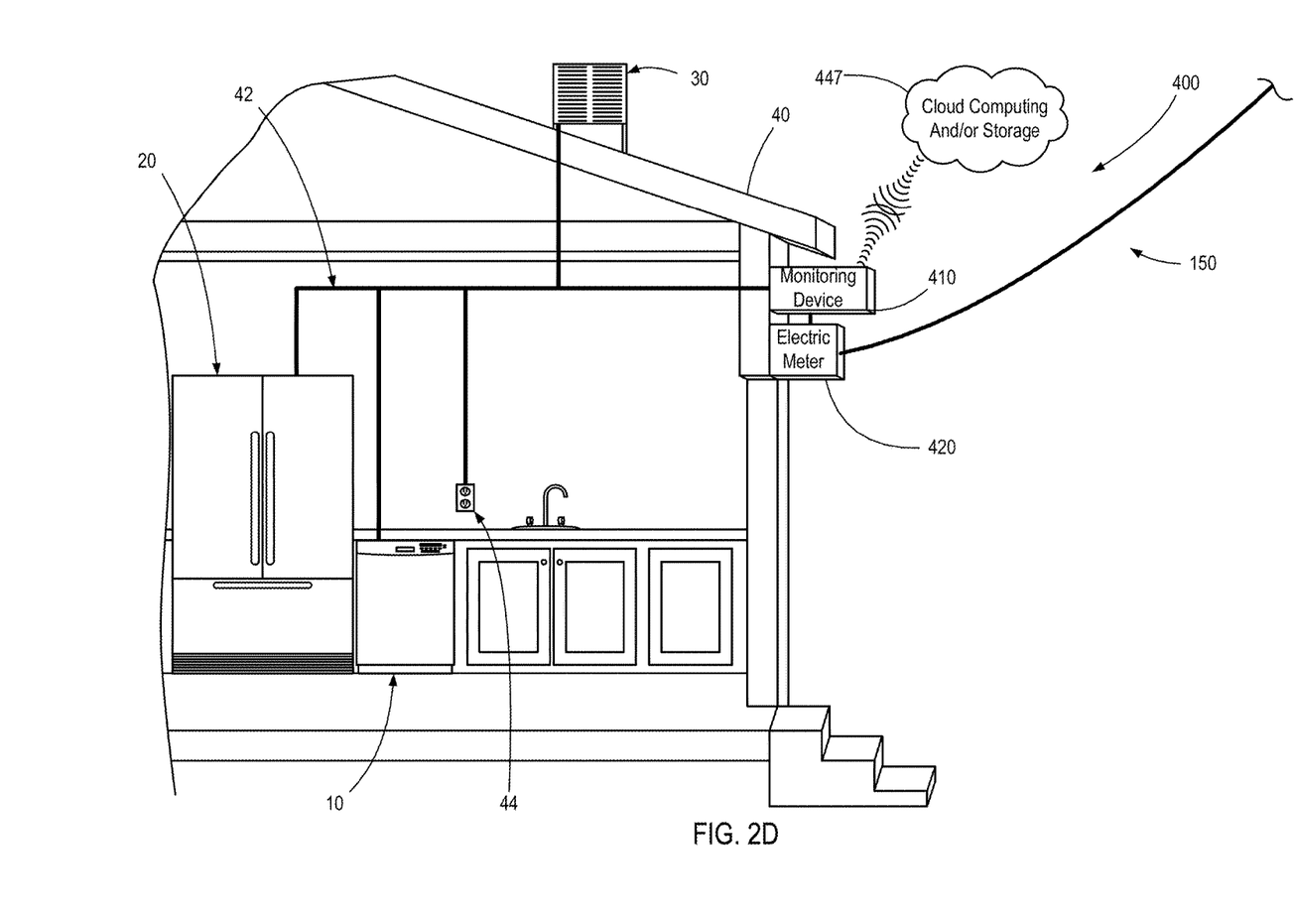
FIG. 2D illustrates a power consumption monitoring system, according to another embodiment, configured to communicate via a wireless connection with a remote cloud-based computing and storage platform.

FIG. 2D illustrates the power consumption monitoring system 400 with the monitoring device 410 that is configured to communicate via a wireless interface with a cloud computing and/or remote storage 447. In various embodiments, the monitoring device 410 may simply gather data and facilitate the transmission of the collected data to remote computing and/or remote storage 447. In such embodiments, the wireless transmission may utilize one or more wireless networks, such as a home Wi-Fi as an intermediary transmission medium, a point-to-point wireless communication system, a satellite communication system, a cellular network communication system, a microwave communication system, and/or any other type of wireless communication system.

In various embodiments, such as that illustrated in FIG. 2D, remote storage 447 may be used to store data associated with baseline signatures of electric devices, usage information, anomaly detection, defect situations, faults, and/or other information.

Figure 3A:
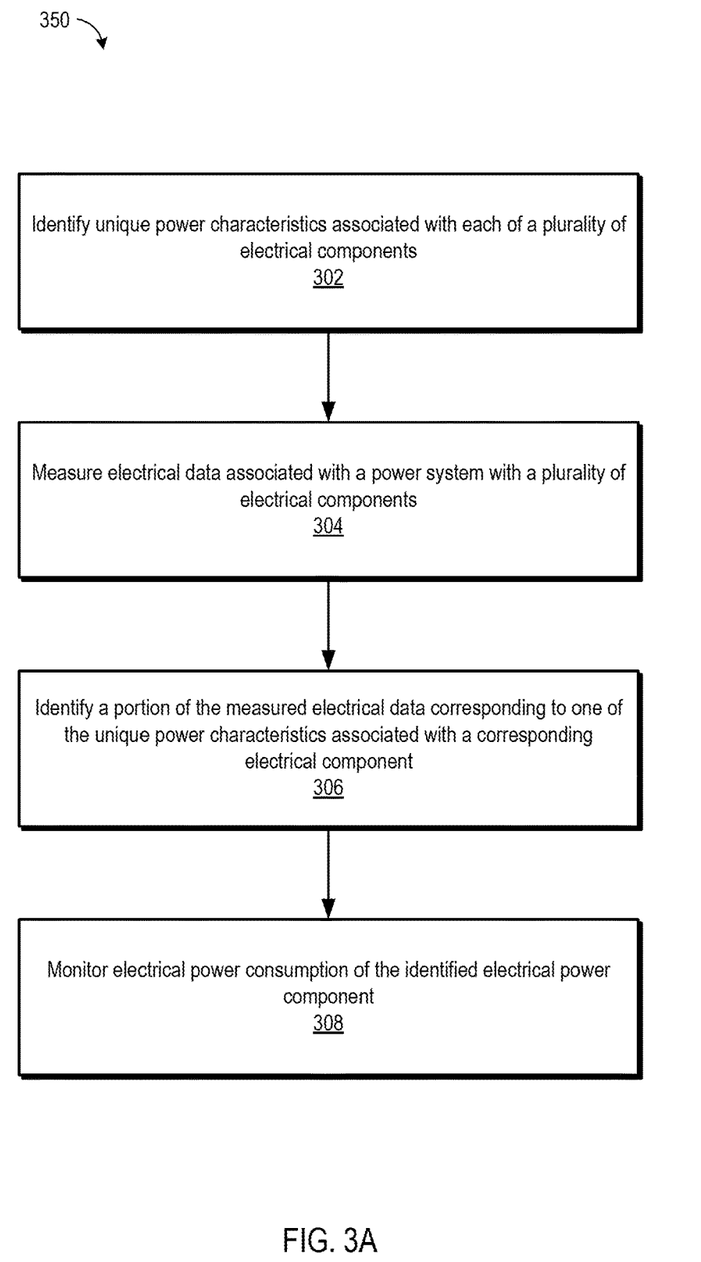
FIG. 3A is a flowchart illustrating a method for analyzing the power consumption of one or more electric devices, according to one embodiment.

FIG. 3A is a flowchart of a method 350 for monitoring (e.g., measuring) the power consumption of a distinct electrical component on a power distribution system via a monitoring device measuring electrical data associated with power being consumed by a plurality of devices. Each of a plurality of electrical components may be identified, at 302, as having a unique power characteristic. Electrical data may be collected, at 304, at a point in an electrical system that feeds a plurality of electrical components. A portion of the measured or gathered electrical data may be analyzed, at 306, to identify as corresponding to a distinct electrical component based on a match with the unique power characteristics of that electrical component. The electric power consumption of the identified electrical component may be monitored, at 308.

The method described in FIG. 3A may be part of a larger series of steps or methods. As described above, each of a plurality of electrical components may be measured and/or calculated to have a specific usage, startup, and shutdown signature. The signature may specifically be an electrical signature characterized by specific voltage levels, current levels, power factor, and/or frequencies as a function of time. As a specific example, turning on a generator may initially have a large inrush of current followed by some ringing at specific frequencies. The time-based current and frequency characteristics of the generator may be used to create a baseline signature. A wide variety of components connected to a single electrical distribution system may each have a unique baseline signature. However, when a combination of a plurality of the electrical components is simultaneously drawing power from a single monitored power source, the signatures may not be easily recognizable.

The present systems and methods contemplate capturing, receiving, and/or measuring a plurality of electric power values of an electric power distribution system. The electric power distribution system may be associated with a residential system, a commercial building, and/or an industrial application. Various electrical components may draw power simultaneously and/or sequentially on the electric power distribution system.

One or more of the electrical components may be or have been determined to have a unique electrical signature. The unique electrical signature may be difficult to recognize and/or distinguished when combined with many other electrical signatures.

According to various embodiments, the electrical signature (e.g., voltage/current/frequency/power factor values over a time period) may have a corresponding signature when analyzed using an FFT, a corresponding signature when analyzed via CVA, a corresponding signature when analyzed via deep learning based analysis, and a corresponding signature when analyzed using SRA. Methods for matching and identification using FFT, CVA, deep learning based analysis, and SRA are well developed. However, they are typically used in their respective fields and not in combination and not to identify and compare electrical signatures.

The systems and methods may include determining an individual confidence index based on one or more of an FFT analysis, a CVA analysis, deep learning based analysis, and/or an SRA analysis. A composite analysis combining all four analyses may be used to identify which specific electrical component has been turned on, has been turned off, is currently operating, is currently malfunctioning, etc.

As a specific example, an FFT analysis might indicate that the measured electrical data has a 60% chance of being associated with an air conditioner, a 30% chance of being associated with an oven, and a 10% chance of being associated with a server. Using this analysis alone, the system might assume it is an air conditioner. A CVA analysis might indicate that there is a 100% certainty that the electrical data is not associated with an air conditioner, a 50% chance of being associated with a server, and a 50% chance of being associated with an oven. This analysis might indicate that the electrical data is most likely associated with the oven. Continuing the example, the SRA analysis of the same data might indicate with a high level of confidence that the electrical data is not associated with an oven, and a low level of confidence that the electrical data is associated with a server. It might be deduced from three or four analyses methods that the measured electrical data is necessarily associated with a server. In another embodiment, the composite analysis might be a weighted average of two or more analysis methods. The weighted average might be one-fourth each, or may be weighted based on likelihood (or non-likelihood) that an identified electrical component is accurate. Some methods known to better detect certain appliance types may have a higher weighting for those appliance types than for other appliance types. Thus, the weighting of each method as it is used in the fusion method may be based at least partially on the type of device being allegedly detected.

Figure 3B:
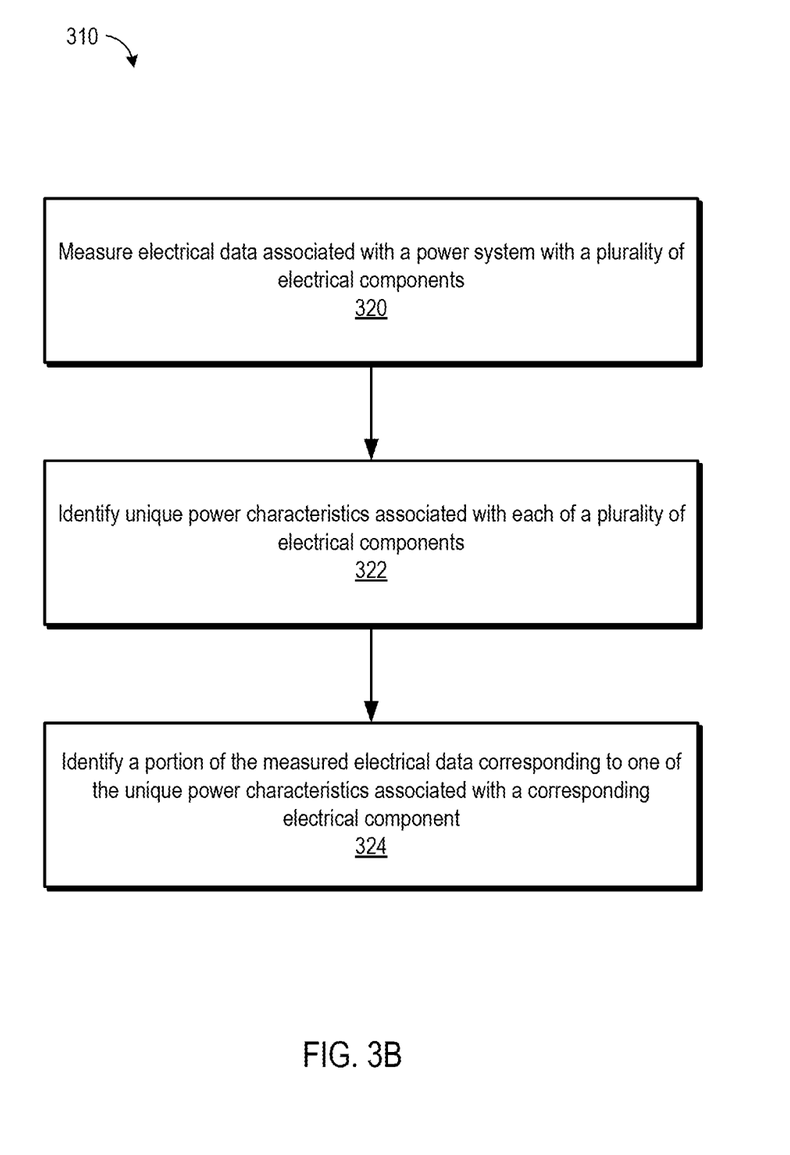
FIG. 3B is a flowchart illustrating a method for analyzing the power consumption of one or more electric devices, according to one embodiment.

FIG. 3B is another flowchart illustrating another method 310 for analyzing the power consumption of one or more electric devices, according to one embodiment. In a basic form, the method 310 may include measuring electrical data associated with a power system with a plurality of electrical components, at 320. Local, or in many instances, remote storage and computing resources may then identify unique power characteristics associated with each of a plurality of electrical components, at 322.

In some embodiments, this may include a disaggregation of the electrical data into component parts or at least portions that can be mapped to corresponding signatures of specific devices or events. Remote processing and/or a storage system may identify a portion of the measured electrical data that corresponds to one or more of the unique power characteristics associated with a corresponding electrical component, at 324. This may include a fusion method that utilizes one or more of the methods described herein in combination, such as a weighted combination that may be dynamically weighted based on the type of appliance and/or even being identified. Moreover, this identification may be based on prior initialization of the system, calibration data, historical data, test data, manufacturers' specifications, and/or other data.

Figure 4:
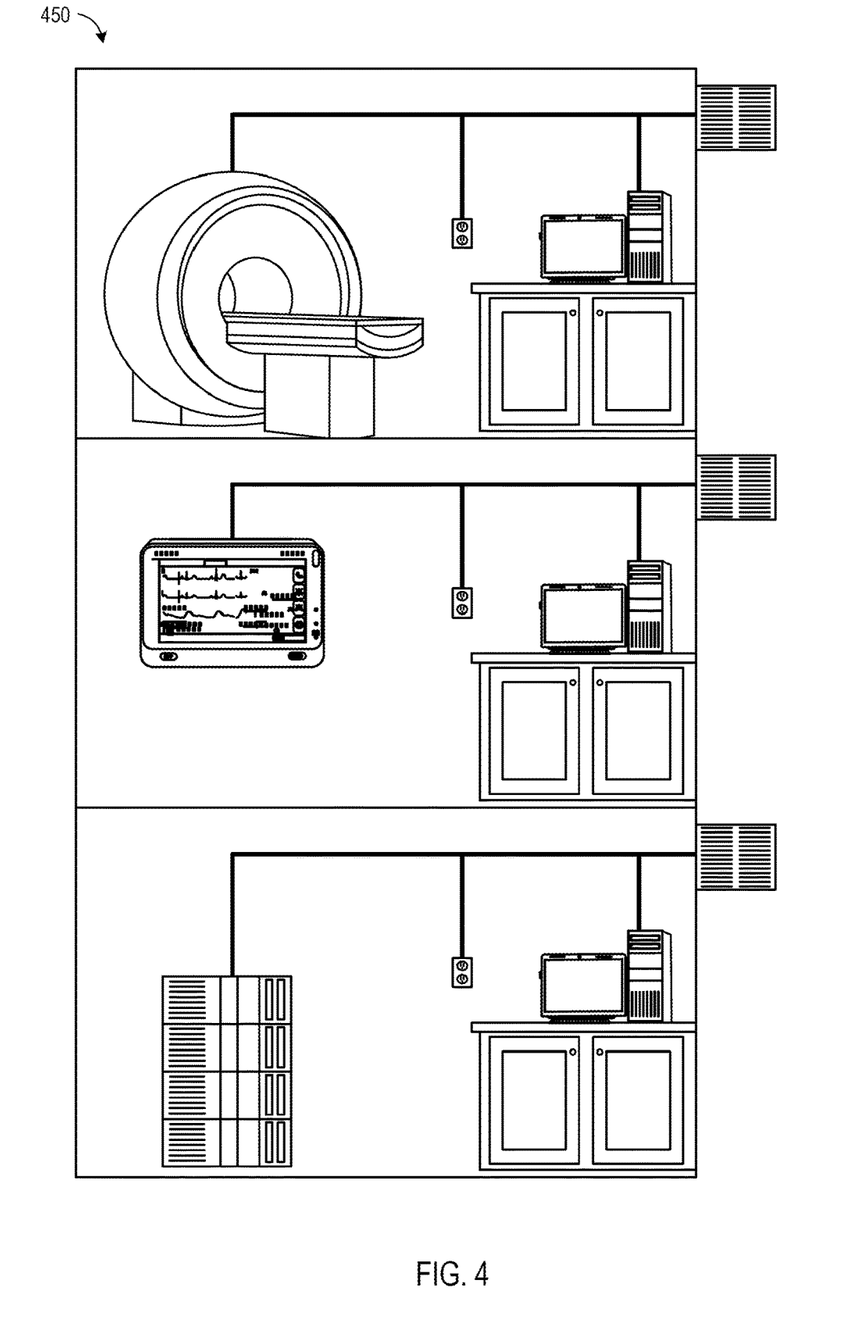
FIG. 4 illustrates a power consumption monitoring system, according to another embodiment, configured to identify discrete electrical components within a commercial building with a large number of electric devices concurrently consuming power.

FIG. 4 illustrates a commercial building 450 with a plurality of floors. A single monitoring device can be used to monitor usage of each component on any of the floors by identifying electrical signatures of the measured electrical data with known electrical signatures of a plurality of components within the system. In some embodiments, a network of monitoring devices may monitor usage of components. Each monitoring device in the network may be assigned to monitor components in a specific area. The monitoring devices may communicate with each other. For example, as each monitoring device creates or updates device profiles, the monitoring device may send the device profile to the other networked monitoring devices. This may allow a second monitoring device to have an accurate device profile when a similar device is added to the area of the second monitoring device.

As previously described, the method of monitoring may include determining a composite confidence index based on an evaluation of each individual confidence index. For example, the composite confidence index may be based on an average of the various individual confidence indices. The method may include reporting at least one of a plurality of electric power consumption values, one or more device profiles corresponding to the plurality of electric power consumption values, one or more individual confidence indices, and/or a composite confidence index.

Figure 5:
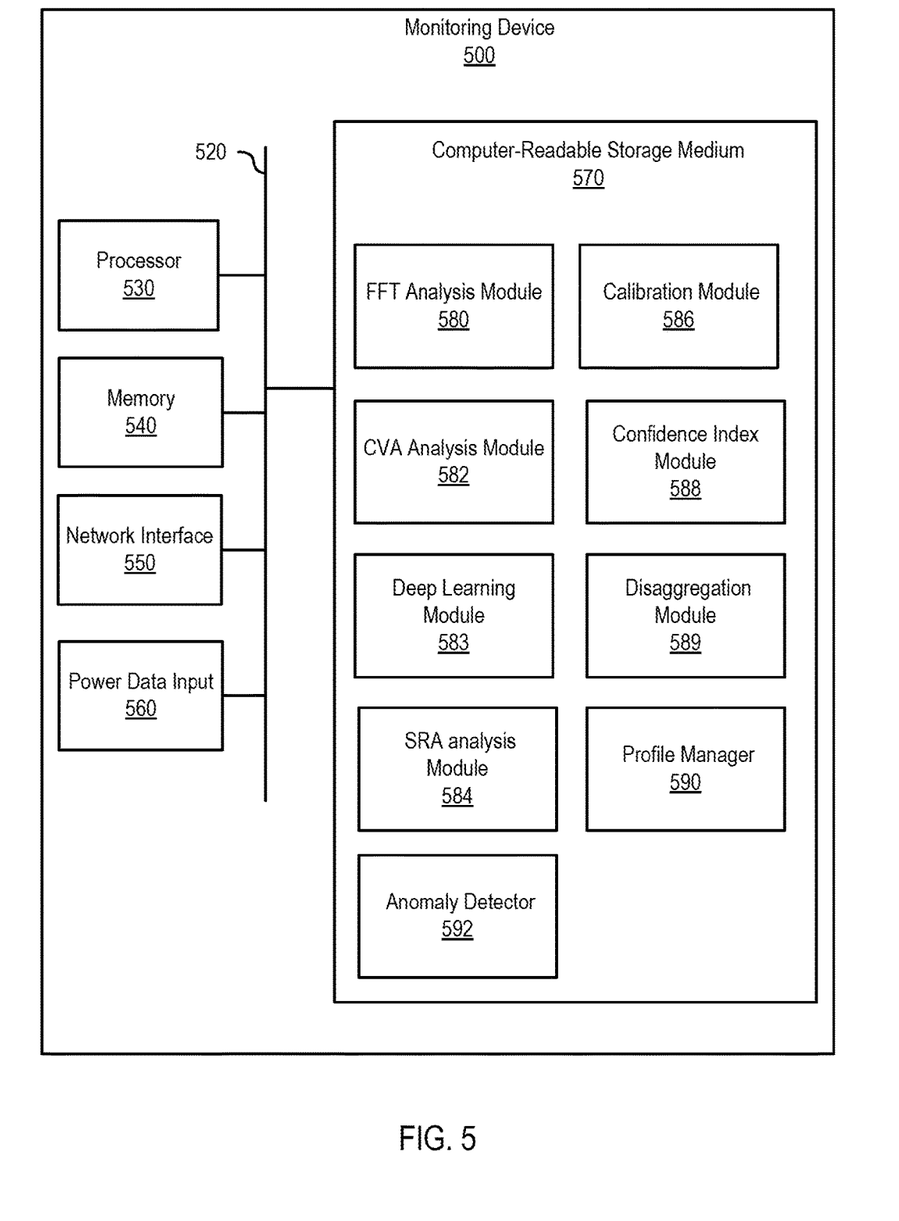
FIG. 5 illustrates a block diagram of a monitoring device.

FIG. 5 illustrates a block diagram of a monitoring device 500. As shown, the monitoring device 500 may include a processor 530, memory 540, a network interface 550, a power data input 560, and other optional components 570. A bus 520 may interconnect various integrated and/or discrete components. Various modules (e.g., modules 580, 582, 584, 586, 588, 589, 590 and 592) may be implemented in hardware, software, firmware, and/or a combination thereof.

The power data input 560 may receive electrical data associated with power being consumed by a plurality of devices. The electrical data may be obtained from an external or internal power meter. In some embodiments, the power data input 560 may include a current or voltage transformer to step down an analog signal carrying the electrical data. In some embodiments, the electrical data received may be a digital signal. In some embodiments, the electrical data may be from each phase of a three-phase power system.

An FFT analysis module 580, a CVA analysis module 582, a deep learning module 583, and/or an SRA analysis module 584 may receive the electrical data from the power data input 560. The FFT analysis module 580 may perform an FFT analysis of the electrical data. The CVA analysis module 582 may perform a CVA analysis of the electrical data. The deep learning module 582 may perform a deep learning analysis of the electrical data. The SRA analysis module 584 may perform an SRA analysis of the electrical data. The results of these three different methods of analysis may indicate which devices of the plurality of devices is operating based on device profiles.

A calibration module 586 may generate device profiles and a profile manager 590 may store device profiles. A baseline or default device profile of each device may be based on historical signatures, factory witness testing, nameplate ratings, manufacturers' specifications, and/or other measured or calculated values. The profile may comprise a usage, startup, and shutdown signature. The signature may specifically be an electrical signature characterized by specific voltage levels, current levels, and/or frequencies as a function of time. As a specific example, turning on a device may initially have a large inrush of current followed by some ringing at specific frequencies. The time-based current and frequency characteristics of the device may be used to create a baseline signature.

To obtain a baseline device profile, the calibration module 586 may request that each device be turned on and off. For example, a user may notify the monitoring device 500 through an application on a smartphone of an additional device to be added to a power system. The monitoring device 500 may send a signal through the network interface 550 to the smartphone notifying the application that the monitoring device 500 is ready to initiate a calibration cycle. The smartphone may display a message requesting that the user turn on and off the device to complete a calibration cycle. The calibration module 586 may record the resulting electrical signature and categorize the signal in the profile manager 590.

The profile manager 590 may store a plurality of profiles. Each profile may include current and voltage information. For example, the profile may include the time-based current and frequency characteristics. Additionally, in some embodiments, the profiles may include the number of phases of a three-phase power system the device uses.

A confidence index module 588 may generate a matrix based on the FFT analysis, CVA analysis, deep learning analysis, and SRA analysis. The matrix may express the likelihood that one portion of the received electrical data corresponds to a specific device profile. The matrix may weight one of the methods of analysis more than the others based on a variety of factors, including current device profiles, historic accuracy, and/or similarity of results.

In some embodiments, when a profile indicates how many phases each device uses, the confidence index module 588 may improve its efficiency by only comparing device profiles that use the same number of phases as a portion of interest of the received electrical data. For example, if a portion of interest appears on two phases, only devices that use 240 volts are compared to the portion of interest. In some environments this may significantly decrease the device profiles to be compared. For instance, in a typical home environment only major appliances operate on a 120V outlet.

By first associating portions identifying the portions that appear across multiple phases, developing the remaining confidence index matrix may be more accurate. For example, in some embodiments, the disaggregation module 589 may separate the multi-phase portion of the received electrical data before the remaining portions are indexed by the confidence index module 588. By separating the multi-phase portions, the remaining electrical data may be analyzed, indexed, and disaggregated in more detail. Electronic signatures that appear as noise before the multi-phase portions are removed may be easily recognizable after the removal of the multi-phase portions. A similar technique may be used to first remove portions of the electrical data based on their amplitudes.

The disaggregation module 589 may separate the received electrical data based on the matrix generated by the confidence index module 588. The disaggregation module 589 may associate each portion of the electrical data with one or more devices to monitor the power consumption of each device. The disaggregation module 589 may include hardware and logic such as a demodulator or FPGA.

An anomaly detector 592 may compare the optimal, historical, or other baseline electric power consumption value with the measured electric power consumption value of the device. Based on the comparison, if the measured value is greater than the baseline or optimal electric power consumption value, then the monitoring device 500 may indicate that the device should be serviced or that maintenance of the device should be scheduled.

Figure 6:
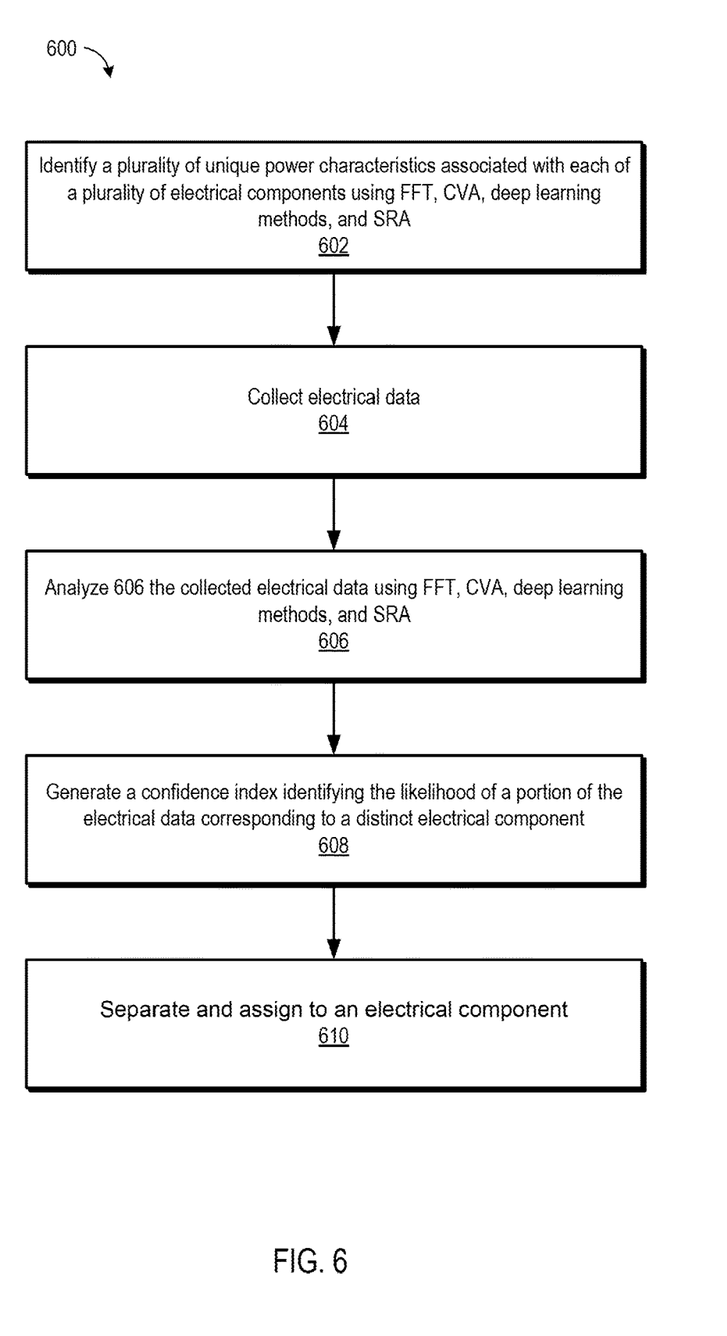
FIG. 6 is a flowchart illustrating a method to identify unique electrical signatures of a plurality of devices, according to one embodiment.

FIG. 6 is a flowchart illustrating a method 600 to identify unique electrical signatures of a plurality of devices, according to one embodiment. The method 600 may identify a plurality of unique power characteristics associated with each of a plurality of electrical components using FFT, CVA, deep learning methods, and SRA. The method 600 may collect 604 electrical data at a point in an electrical system that provides power to each of the plurality of electrical components. The method 600 may analyze 606 the collected electrical data using FFT, CVA, deep learning methods, and SRA to identify a portion of the electrical data with features that correspond to one of the identified unique power characteristics associated with an electrical component. The method 600 may further generate 608 a confidence index identifying the likelihood of a portion of the electrical data corresponding to a distinct electrical component, wherein the confidence index is based on the similarities found between a profile of the distinct electrical component and the results from one or more analysis methods of the collected electrical data. The collected electrical data may be separated and each piece assigned 610 to an electrical component.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims:

What is claimed:

1. An electrical monitoring device for proactive maintenance of an electrical appliance in an electrical power distribution system, comprising:
    at least two current sensors to measure current values on at least two electrical lines of an electrical power distribution system;
    an input to receive aggregated measured electric power values from the at least two current sensors representing electric power consumption of a plurality of electrical appliances, including a first electrical appliance;
    a memory to store a profile for each of the plurality of electrical appliances, wherein each profile includes an electrical signature and historical baseline electrical power consumption values of each respective electrical appliance;
    a signal analyzer in electrical communication with the memory to:
        compare the stored electrical signatures with the aggregated measured electrical power values, and
        identify a plurality of profiles, including the profile of the first electrical appliance, that collectively correspond to the aggregated measured electrical power values;
    a disaggregator to separate the aggregated measured electric power values and identify real-time electric power values associated with the first electrical appliance;
    an anomaly detector to identify anomalous behavior of the first electrical appliance by comparing the separated, real-time electric power values of the first electrical appliance and the stored historical baseline electrical power consumption values of the electrical appliance; and
    a communication transceiver in communication with a local network computing device, the communication transceiver to utilize a network of local computing devices to transmit a service request for the electrical appliance.

2. The electrical monitoring device of claim 1, further comprising an integrated electric power meter in electrical communication with the input that measures power on a three-phase system.

3. The electrical monitoring system of claim 1, wherein the anomaly detector issues the service request for the electrical appliance via the communication transceiver.

4. The electrical monitoring system of claim 1, wherein the anomaly detector outputs a signal that trips a circuit breaker when the identified real-time electric power values associated with the first electrical appliance exceed a threshold difference from the stored historical baseline electric power consumption values.

5. An electrical monitoring system comprising:
    a plurality of current sensors to collect current measurement data from each of a plurality of different locations within an electric power distribution system;
    a plurality of electrical monitoring devices to receive electrical data from each of the plurality of current sensors, each electrical monitoring device comprising:
        an input to receive the electrical data from each of the plurality of current sensors as part of aggregated measured electric power values representing electric power consumption of a plurality of devices;
        a profile manager to create and store a plurality of profiles, each profile being associated with one of a plurality of devices that consume electric power and comprising power consumption characteristics of each respective device, wherein each profile comprises a baseline electrical power consumption value;
        a signal analyzer in electrical communication with the profile manager to determine the likelihood of a profile corresponding to a portion of the aggregated measured electric power values based on a comparison between the received aggregated measured electric power values and the profile; and
        a disaggregator to separate the aggregated measured electric power values received by the input into portions and associate each portion with at least one of the plurality of devices based on the signal analyzer's determination;
    at least one anomaly detector to identify anomalous behavior of a selected device of the plurality of devices by comparing the separated portion of the aggregated measured electric value for the selected device with the baseline electrical power consumption value of the stored profile of the selected device; and
    a communication transceiver in communication with the anomaly detector to transmit an identified anomaly with the selected device,
    wherein each of the plurality of electrical monitoring devices is in communication with each other and distribute profiles created by each profile manager to each of the electrical monitoring devices.

6. The electrical monitoring system of claim 5, wherein each profile comprises time-based current, voltage, and frequency characteristics of the device.

7. The electrical monitoring system of claim 5, wherein each profile comprises event-based current, voltage, and frequency characteristics of the device.

8. The electrical monitoring system of claim 5, wherein each profile comprises multi-phase characteristics of the device.

9. The electrical monitoring system of claim 5, wherein the profile manager is preprogrammed with a plurality of baseline profiles based on device specifications.

* * * * *